(12) United States Patent  
Shirai et al.

(10) Patent No.: US 8,648,628 B2  
(45) Date of Patent: Feb. 11, 2014

(54) DIFFERENTIAL OUTPUT BUFFER

(75) Inventors: Junichiro Shirai, Tokyo (JP); Katsuki Matsudera, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/238,200

(22) Filed: Sep. 21, 2011

(65) Prior Publication Data

US 2012/0194225 A1 Aug. 2, 2012

(30) Foreign Application Priority Data

Feb. 2, 2011 (JP) ................................. 2011-020380

(51) Int. Cl.
*H03K 3/00* (2006.01)

(52) U.S. Cl.
USPC .......................................................... 327/108

(58) Field of Classification Search
None
See application file for complete search history.

(56) References Cited

U.S. PATENT DOCUMENTS

| | | | |
|---|---|---|---|
| 5,200,710 A | 4/1993 | Kato | |
| 5,736,869 A * | 4/1998 | Wei | 326/81 |
| 7,259,592 B2 * | 8/2007 | Lee et al. | 326/83 |
| 7,450,437 B2 | 11/2008 | Choi | |
| 7,486,702 B1 | 2/2009 | Yang | |
| 7,733,118 B2 | 6/2010 | Hollis et al. | |
| 2004/0100307 A1 * | 5/2004 | Wong et al. | 326/115 |

FOREIGN PATENT DOCUMENTS

| | | |
|---|---|---|
| JP | H04-115622 | 4/1992 |
| JP | 04-170109 | 6/1992 |
| JP | 05-258588 | 10/1993 |
| JP | 2006-157649 | 6/2006 |
| JP | 2007-060073 | 3/2007 |

OTHER PUBLICATIONS

Office Action received in corresponding Japanese Application No. 2011-020380 dated Nov. 26, 2013.

* cited by examiner

*Primary Examiner* — Lincoln Donovan
*Assistant Examiner* — Khareem E Almo
(74) *Attorney, Agent, or Firm* — White & Case LLP

(57) ABSTRACT

According to one embodiment, a main driver is configured to shift the level of a differential signal. A bypass circuit is configured to bypass current flowing through the main driver in such a manner as to contain the change amount of current running through the main driver flowing from a high power supply potential to a low power supply potential within a fixed range upon transition between an operating state and a standby state of the main driver.

11 Claims, 6 Drawing Sheets

DIFFERENTIAL OUTPUT BUFFER

CROSS-REFERENCE TO RELATED APPLICATIONS

This application is based upon and claims the benefit of priority from Japanese Patent Application No. 2011-20380, filed on Feb. 2, 2011; the entire contents of which are incorporated herein by reference.

FIELD

Embodiments described herein relate generally to a differential output buffer.

BACKGROUND

A differential output buffer may be used to suppress crosstalk and SSO (Simultaneous Switching Output) noise upon the transmission of a differential signal. At this time, if switching between a transmission state and a standby state is performed, common current changes suddenly. Therefore, noise is generated in power supply voltage due to the influence of a parasitic inductance of, for example, a package, and an increase in clock jitter is caused at a receiver side.

DETAILED DESCRIPTION

In general, according to one embodiment, a differential output buffer includes a main driver and a bypass circuit. The main driver shifts the level of a differential signal. The bypass circuit bypasses current flowing through the main driver in such a manner as to contain the change amount of current through the main driver flowing from a high power supply potential to a low power supply potential within a fixed range upon transition between an operating state and a standby state of the main driver.

Exemplary embodiments of the differential output buffer will be explained below in detail with reference to the accompanying drawings. The present invention is not limited to the following embodiments.

First Embodiment

Figure 1:
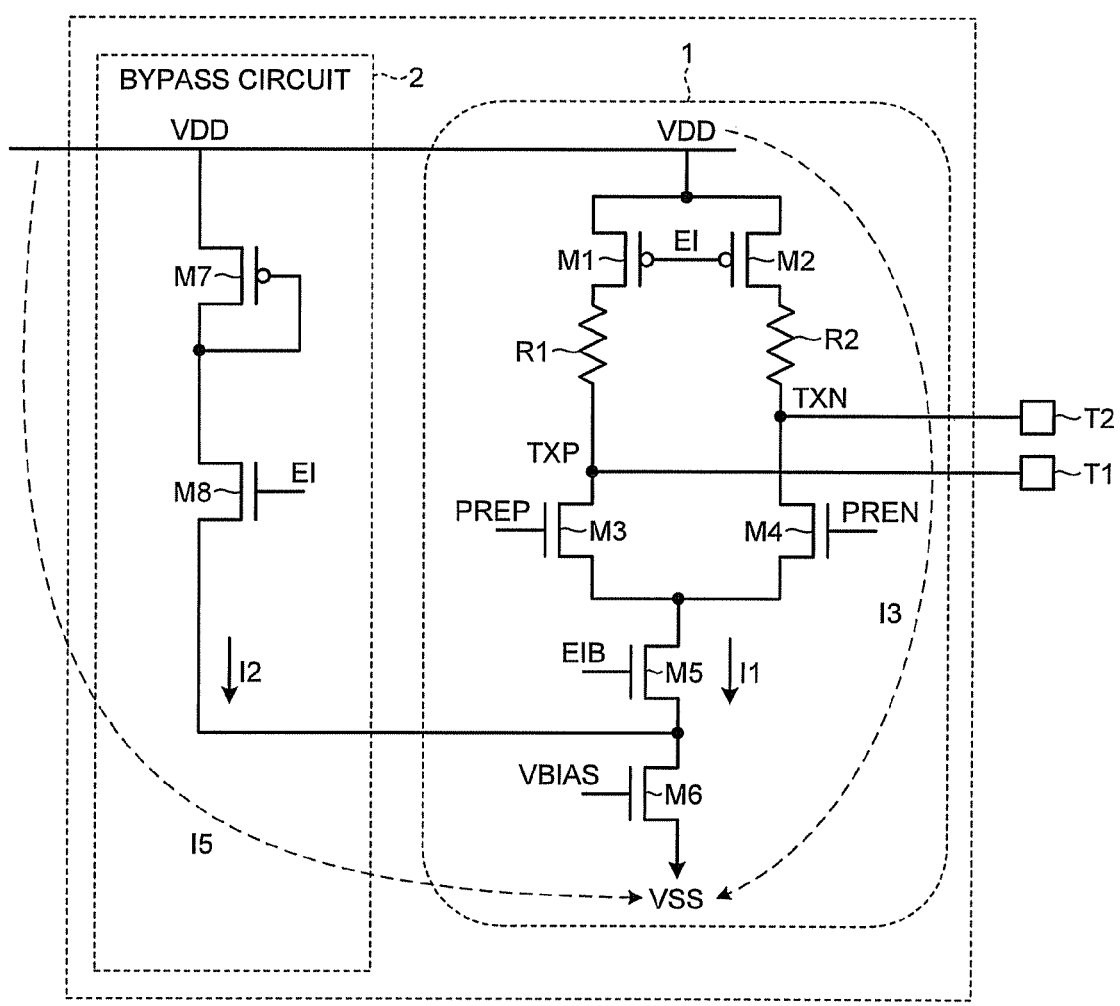
FIG. 1 is a circuit diagram schematically illustrating a configuration of a differential output buffer according to a first embodiment.

FIG. 1 is a circuit diagram schematically illustrating a configuration of a differential output buffer according to a first embodiment.

In FIG. 1, the differential output buffer includes a main driver 1 and a bypass circuit 2. The main driver 1 can shift the level of differential signals PREP and PREN. The bypass circuit 2 can bypass common current I3 flowing through the main driver 1 in such a manner as to contain the change amount of current I5 flowing from a high power supply potential VDD to a low power supply potential VSS within a fixed range upon transition between an operating state and a standby state of the main driver 1.

Here, the main driver 1 has switching transistors M1, M2, and M5, differential transistors M3 and M4, a bias transistor M6, and resistors R1 and R2. The bypass circuit 2 has bypass transistors M7 and M8. For example, p-channel field-effect transistors may be used as the switching transistors M1 and M2 and the bypass transistor M7, and n-channel field-effect transistors may be used as the differential transistors M3 and M4, the switching transistor M5, the bias transistor M6, and the bypass transistor M8. Moreover, the values of the resistors R1 and R2 may be set at 50Ω, for example.

Here, the differential transistors M3 and M4 can constitute a differential pair. The switching transistors M1, M2, and M5 can switch an operating state and a standby state of the differential transistors M3 and M4. The bias transistor M6 can set bias currents I1 through the differential transistors M3 and M4. The bypass transistors M7 and M8 can maintain current I5 flowing from the high power supply potential VDD to the low power supply potential VSS constant by making bypass current I2 to flow via the bias transistor M6 upon transition between the operating state and the standby state of the main driver 1.

Specifically, sources of the switching transistors M1 and M2 are connected to the high power supply potential VDD, and gates of the switching transistors M1 and M2 are connected to each other. A drain of the switching transistor M1 is connected to a drain of the differential transistor M3 via the resistor R1, and a drain of the switching transistor M2 is connected to a drain of the differential transistor M4 via the resistor R2. Drains of the differential transistors M3 and M4 are connected to output terminals T1 and T2, respectively.

Sources of the differential transistors M3 and M4 are connected to the low power supply potential VSS via the switching transistor M5 and the bias transistor M6 in order. A source of the bypass transistor M7 is connected to the high power supply potential VDD, a gate and a drain of the bypass transistor M7 are connected to a drain of the bypass transistor M8, and a source of the bypass transistor M8 is connected to a drain of the bias transistor M6.

The differential signals PREP and PREN are inputted to gates of the differential transistors M3 and M4, respectively. Switching signals EI are inputted to the gates of the switching transistors M1 and M2 and a gate of the bypass transistor M8. An inverting switching signal EIB is inputted to a gate of the switching transistor M5. Bias voltage VBIAS is inputted to a gate of the bias transistor M6.

Figure 2:
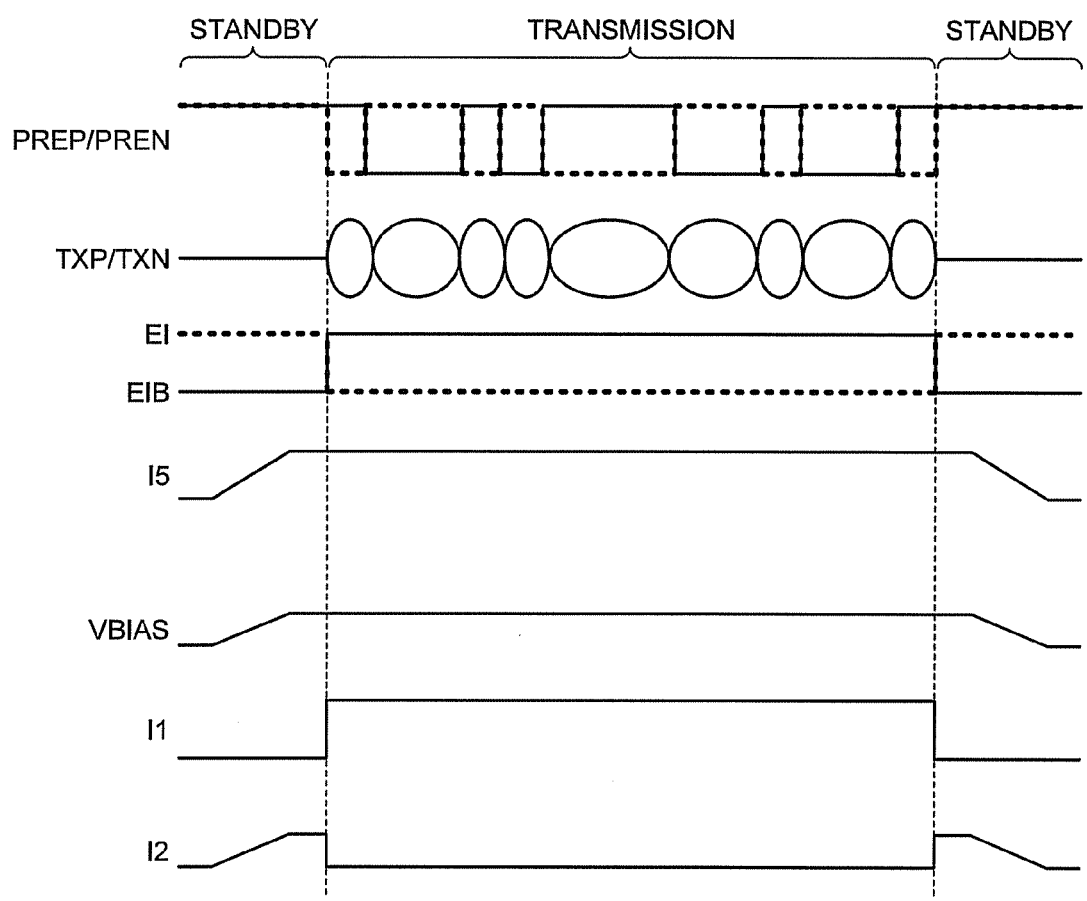
FIG. 2 is a timing chart of any one of a voltage waveform and current waveforms of each part of the differential output buffer of FIG. 1.

FIG. 2 is a timing chart of any one of a voltage waveform and current waveforms of each part of the differential output buffer of FIG. 1.

In FIG. 2, in a transmission state of the main driver 1, the switching signal EI is maintained at low level, and the switching transistors M1, M2, and M5 are switched on; accordingly, the differential transistors M3 and M4 are connected to the high power supply potential VDD and the low power supply potential VSS. Moreover, when the switching signal EI is maintained at low level, the bypass transistor M8 is switched off, and the bypass current I2 is set to 0.

Furthermore, the bias voltage VBIAS is set in such a manner as to bring the bias currents I1 through the differential transistors M3 and M4 to a specified value, and the bias current I1 flows to the low power supply potential VSS side via the bias transistor M6; accordingly, the common current I3 equal to the value of the bias current I1 flows via the main driver 1. The bias current I1 in the transmission state of the main driver 1 may be set at 10 mA, for example.

Then, when the differential signals PREP and PREN are inputted to the gates of the differential transistors M3 and M4, differential outputs TXP and TXN are generated in accordance with the differential signals PREP and PREN, and are outputted through the output terminals T1 and T2.

On the other hand, in the standby state of the main driver 1, the differential signals PREP and PREN are fixed at high level. Moreover, the switching signal EI is switched from low level to high level, and the switching transistors M1, M2, and M5 are switched off; accordingly, the differential transistors M3 and M4 are separated from the high power supply potential VDD and the low power supply potential VSS. Therefore, the bias currents I1 through the differential transistors M3 and M4 are brought to 0, and the common current flowing through the main driver 1 is brought to 0.

Here, when the switching signal EI is maintained at high level, the bypass transistor M8 is switched on, and the bypass current I2 is outputted from the bypass circuit 2. Upon transition between the operating state and the standby state of the main driver 1, the bias voltage VBIAS is set in such a manner as to make the value of the bypass current I2 to be equal to the value of the common current I3 through the main driver 1 in the transmission state, and the bypass current I2 equal to the value of the common current I3 through the main driver 1 in the transmission state flows to the low power supply potential VSS side via the bias transistor M6. Therefore, the current I5 flowing from the high power supply potential VDD to the low power supply potential VSS is maintained constant even if the values of the bias currents I1 flowing via the differential transistors M3 and M4 are brought to 0 upon transition between the operating state and the standby state of the main driver 1.

Here, if the common current I3 flowing through the main driver 1 in the standby state is changed, the bypass current I2 can be slowly increased and decreased and the current I5 flowing from the high power supply potential VDD to the low power supply potential VSS can be moderately changed by slowly increasing and decreasing the bias voltage VBIAS.

As a result, even if switching is performed between the transmission state and the standby state, the current I5 flowing from the high power supply potential VDD to the low power supply potential VSS is prevented from changing suddenly. Consequently, noise is prevented from being generated in power supply voltage due to the influence of a parasitic inductance of, for example, a package, and an increase in clock jitter is suppressed at a receiver side.

Moreover, including the bypass circuit 2 allows for preventing the current I5 flowing from the high power supply potential VDD to the low power supply potential VSS from changing suddenly without reducing the switching speed between the transmission state and the standby state. As a result, occurrence of a large difference in the common level between the transmission state and the standby state is preventable, and increase in potential difference and in transition time between the transmission state and the standby state is preventable. The circuit configuration of the bypass circuit 2 is an example and is not limited to the embodiment. For example, in case where the current I5 is controllable by the bypass transistor M8 alone, the bypass transistor M7 may be eliminated, and another configuration may be added to control the current I5 more precisely. The same can be applied to the following embodiments.

Second Embodiment

Figure 3:
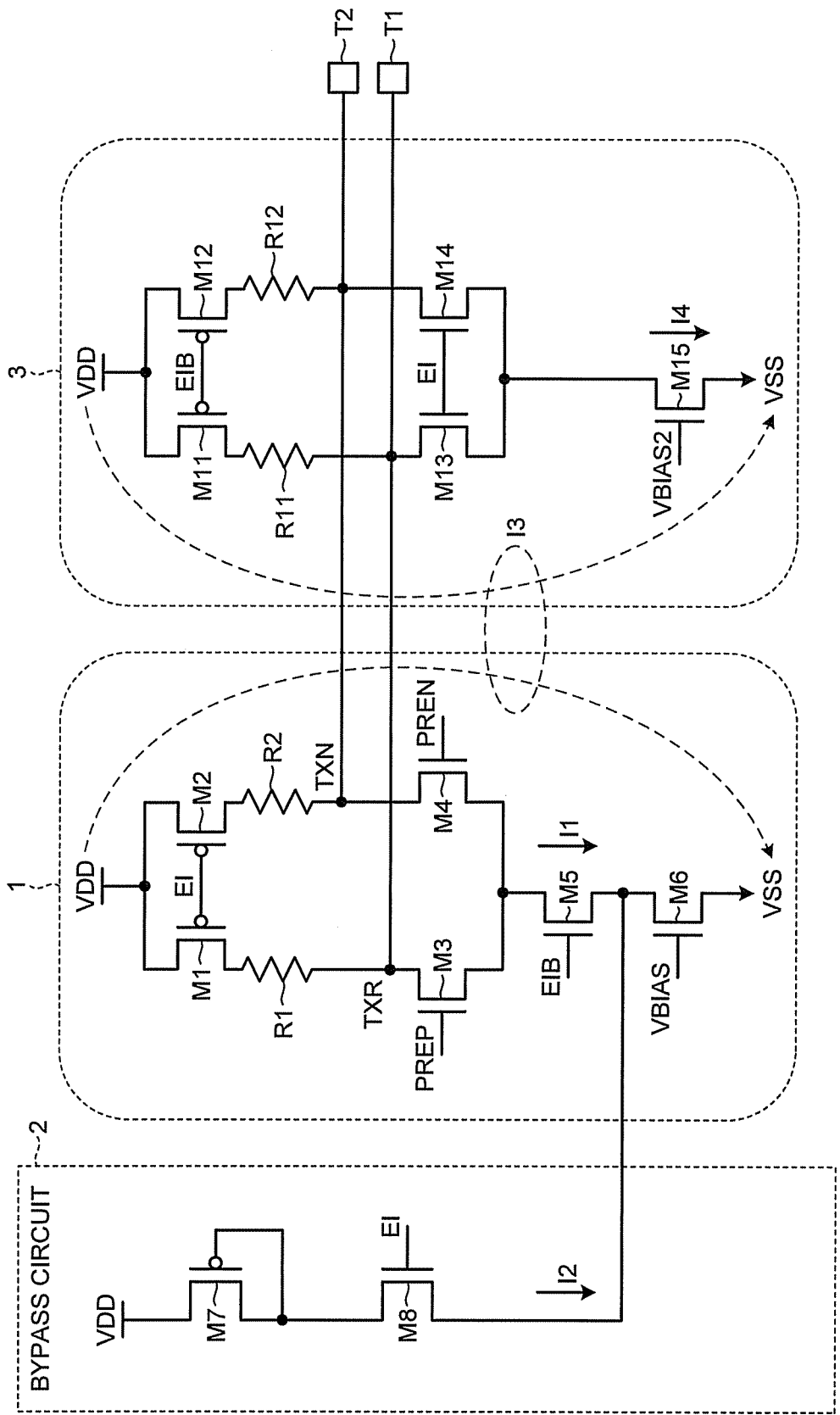
FIG. 3 is a circuit diagram schematically illustrating a configuration of a differential output buffer according to a second embodiment.

FIG. 3 is a circuit diagram schematically illustrating a configuration of a differential output buffer according to a second embodiment.

In FIG. 3, a standby driver 3 is added to the differential output buffer of FIG. 1, in this differential output buffer. The standby driver 3 can fix the differential outputs TXR and TXN of the main driver 1 at a common potential in the standby state.

Here, the standby driver 3 has switching transistors M11 to M14, a bias transistor M15, and resistors R11 and R12. For example, p-channel field-effect transistors may be used as the switching transistors M11 and M12, and n-channel field-effect transistors may be used as the switching transistors M13 and M14 and the bias transistor M15, for example. Moreover, the values of the resistors R11 and R12 may be at 2 kΩ, for example.

Here, the switching transistors M11 to M14 can switch connection states between the standby driver 3 and the main driver 1. The bias transistor M15 can set bias currents I4 through the switching transistors M11 to M14.

Specifically, sources of the switching transistors M11 and M12 are connected to the high power supply potential VDD, and gates of the switching transistors M11 and M12 are connected to each other. A drain of the switching transistor M11 is connected to a drain of the switching transistor M13 via the resistor R11, and a drain of the switching transistor M12 is connected to a drain of the switching transistor M14 via the resistor R12. Gates of the switching transistors M13 and M14 are connected to each other, and drains of the switching transistors M13 and M14 are connected to the output terminals T1 and T2, respectively. Sources of the switching transistors M13 and M14 are connected to the low power supply potential VSS via the bias transistor M15.

The switching signals EI are inputted to the gates of the switching transistors M13 and M14. The inverting switching signals EIB are inputted to the gates of the switching transistors M11 and M12. Bias voltage VBIAS2 is inputted to a gate of the bias transistor M15.

Then, in the transmission state of the main driver 1, the switching signal EI is maintained at low level, and the switching transistors M1, M2, and M5 are switched on; accordingly, the differential transistors M3 and M4 are connected to the high power supply potential VDD and the low power supply potential VSS. Moreover, when the switching signal EI is maintained at low level, the bypass transistor M8 is switched off, and the bypass current I2 is set to 0. Furthermore, when the switching signal EI is maintained at low level, the switching transistors M11 to M14 are switched off, and the standby driver 3 is separated from the main driver 1.

Moreover, the bias voltage VBIAS is set in such a manner as to bring the bias currents I1 through the differential transistors M3 and M4 to a specified value, and the bias current I1 flows to the low power supply potential VSS side via the bias transistor M6; accordingly, the common current I3 equal to the value of the bias current I1 flows via the main driver 1. For example, the bias current I1 in the transmission state of the main driver 1 may be set at 10 mA.

Then, when the differential signals PREP and PREN are inputted to the gates of the differential transistors M3 and M4, the differential outputs TXP and TXN are generated in accordance with the differential signals PREP and PREN and are outputted through the output terminals T1 and T2.

On the other hand, in the standby state of the main driver 1, the differential signals PREP and PREN are fixed at high level. Moreover, the switching signal EI is switched from low level to high level, and the switching transistors M1, M2, and M5 are switched off; accordingly, the differential transistors M3 and M4 are separated from the high power supply potential VDD and the low power supply potential VSS, and the bias currents I1 through the differential transistors M3 and M4 are brought to 0.

Furthermore, when the switching signal EI is switched from low level to high level, the switching transistors M11 to M14 are switched on, and the standby driver 3 is connected to the main driver 1. Then, the bias voltage VBIAS2 is set in such a manner as to bring the bias currents I4 through the switching transistors M11 to M14 to a specified value in the standby state of the main driver 1, and the bias current I4 flows via the bias transistor M15; accordingly, the differential outputs TXR and TXN of the main driver 1 are fixed at the common potential and are outputted through the output terminals T1 and T2. For example, the bias current I4 flowing via the bias transistor M15 may be set at 1 mA in the standby state of the main driver 1. Therefore, the bias current through the differential output buffer decreases from I1 to I4.

Here, when the switching signal EI is maintained at high level, the bypass transistor M8 is switched on, and the bypass current I2 is outputted from the bypass circuit 2. Then, upon transition between the operating state and the standby state of the main driver 1, the bias voltage VBIAS is set in such a manner that the bypass current I2 compensates for decreases in the bias current through the differential output buffer; accordingly, the bias current I2 flows to the low power supply potential VSS side via the bias transistor M6. As a result, even if the values of the bias currents I1 flowing via the differential transistors M3 and M4 are brought to 0 upon transition between the operating state and the standby state of the main driver 1, the common current I3 flowing through the differential output buffer is maintained constant.

Here, the differential output buffer's including the standby driver 3 allows for fixation of the output of the differential output buffer in the standby state and stabilization of the operation of the differential output buffer.

Third Embodiment

Figure 4:
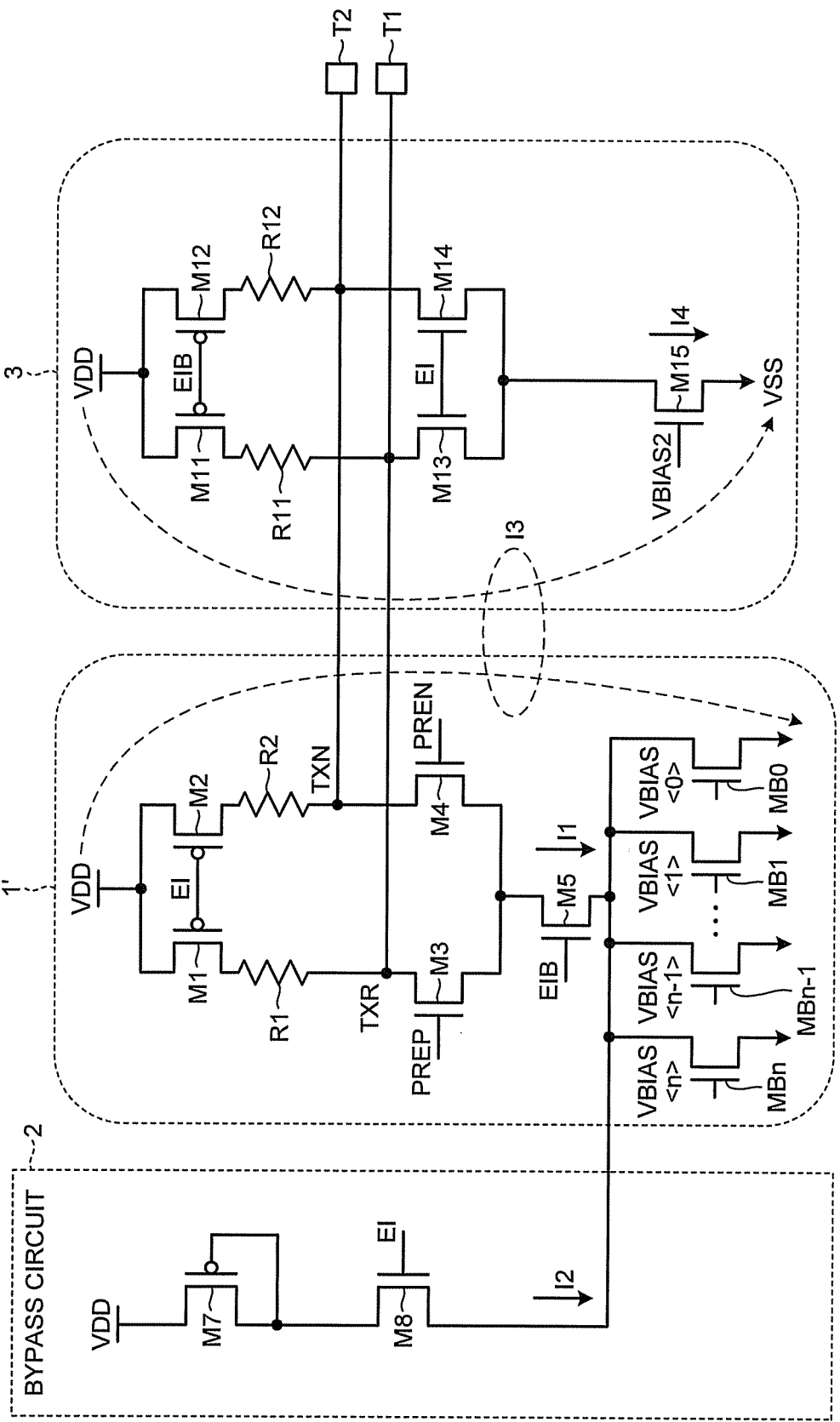
FIG. 4 is a circuit diagram schematically illustrating a configuration of a differential output buffer according to a third embodiment.

FIG. 4 is a circuit diagram schematically illustrating a configuration of a differential output buffer according to a third embodiment.

In FIG. 4, the differential output buffer includes a main driver 1' instead of the main driver 1 of FIG. 3. The main driver 1' has parallel transistors MB0 to MBn instead of the bias transistor M6 of FIG. 3. For example, n-channel field-effect transistors may be used as the parallel transistors MB0 to MBn. Here, the parallel transistors MB0 to MBn are connected in parallel with each other. Drains of the parallel transistors MB0 to MBn are connected to a source of the switching transistor M5, and sources of the parallel transistors MB0 to MBn are connected to the low power supply potential VSS. Bias voltages VBIAS<0> to VBIAS<n> are inputted to gates of the parallel transistors MB0 to MBn, respectively.

Figure 5:
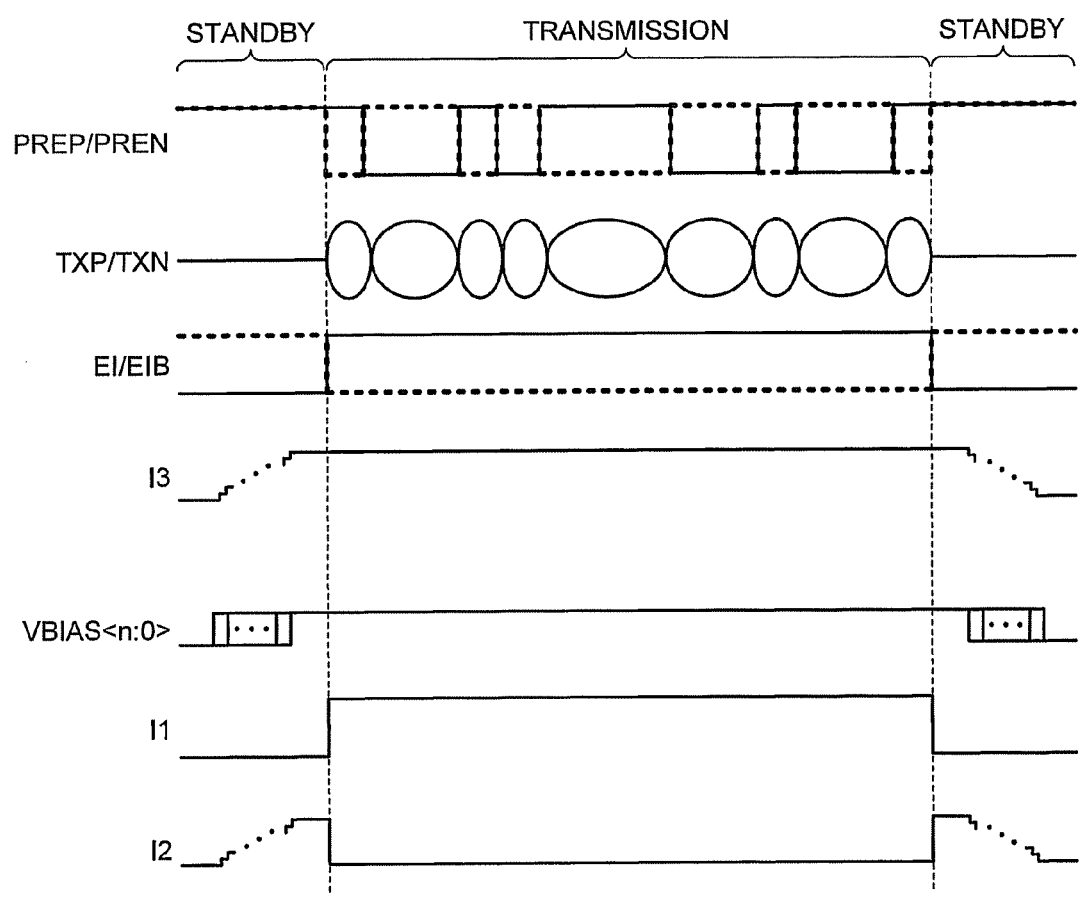
FIG. 5 is a timing chart of any one of a voltage waveform and current waveforms of each part of the differential output buffer of FIG. 4.

FIG. 5 is a timing chart of any one of a voltage waveform and current waveforms of each part of the differential output buffer of FIG. 4.

In FIG. 5, the differential output buffer of FIG. 4 is the same in operation as the differential output buffer of FIG. 1 except that the common current I3 is made to increase and decrease in stages in the standby state.

In other words, in the standby state, the bias voltages VBIAS<0> to VBIAS<n> are sequentially applied to the gates of the parallel transistors MB0 to MBn before the start of transmission; accordingly, the bypass current I2 is increased in stages, and the common current I3 is increased in stages. On the other hand, in the standby state, the bias voltages VBIAS<0> to VBIAS<n> applied respectively to the parallel transistors MB0 to MBn are sequentially interrupted after the end of transmission; accordingly, bypass current I2 is decreased in stages, and the common current I3 is decreased in stages.

As a result, configuration of a circuit for increasing and decreasing the common current I3 in the standby state is facilitated, and increase in complexity of a circuit configuration is preventable, while sudden change of the common current I3 through the main driver 1' is preventable.

Although the description has been given of a method for changing the common current I3 through the differential output buffer of FIG. 3 in stages in the example of FIG. 5, it may be configured to change the common current I3 through the differential output buffer of FIG. 1 in stages.

Fourth Embodiment

Figure 6:
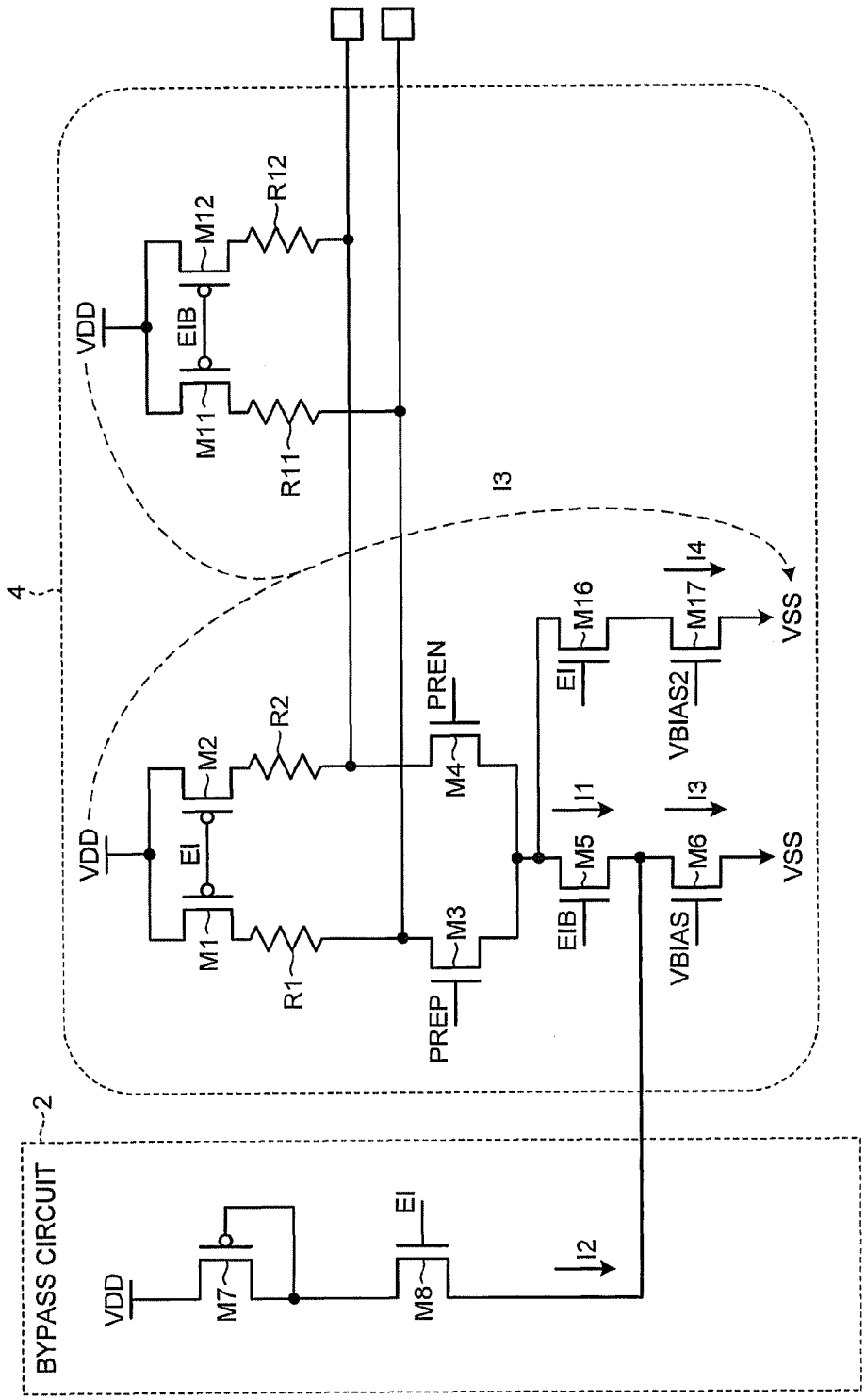
FIG. 6 is a circuit diagram schematically illustrating a configuration of a differential output buffer according to a fourth embodiment.

FIG. 6 is a circuit diagram schematically illustrating a configuration of a differential output buffer according to a fourth embodiment.

In FIG. 6, the differential output buffer includes a driver 4 instead of the main driver 1 of FIG. 1. The driver 4 may have, in addition to the functions of the main driver 1 of FIG. 1, the functions of the standby driver 3 of FIG. 3. In other words, the driver 4 can shift the level of the differential signals PREP and PREN in the operating state and fix the differential outputs TXR and TXN at the common potential in the standby state.

Here, the driver 4 has a switching transistor M16 and a bias transistor M17 instead of the switching transistors M13 and M14 and the bias transistor M15 of FIG. 3. For example, n-channel field-effect transistors may be used as the switching transistor M16 and the bypass transistor M17.

The switching transistor M16 can switch the operating state and the standby state of the differential transistors M3 and M4. The bias transistor M17 can set the bias currents I4 through the differential transistors M3 and M4 in the standby state.

Then, the sources of the differential transistors M3 and M4 are connected to the low power supply potential VSS via the switching transistor M16 and the bias transistor M17 in order. The switching signal EI is inputted to a gate of the switching transistor M16. The bias voltage VBIAS2 is inputted to a gate of the bias transistor M17.

Then, in the transmission state of the driver 4, the switching signal EI is maintained at low level, and the switching transistors M1, M2, and M5 are switched on; accordingly, the differential transistors M3 and M4 are connected to the high power supply potential VDD and the low power supply potential VSS via the switching transistors M1, M2, and M5. Furthermore, when the switching signal EI is maintained at low level, the bypass transistor M8 is switched off, and the bypass current I2 is set to 0. Moreover, when the switching signal EI is maintained at low level, the switching transistor M16 is switched off, and the differential transistors M3 and M4 are separated from the bias transistor M17.

Additionally, the bias voltage VBIAS is set in such a manner as to bring the bias currents I1 through the differential transistors M3 and M4 to a specified value, and the bias current I1 flows to the low power supply potential VSS side via the bias transistor M6; accordingly, the common current I3 equal to the value of the bias current I1 flows through the driver 4.

Then, if the differential signals PREP and PREN are inputted to the gates of the differential transistors M3 and M4, the differential outputs TXP and TXN are generated in accordance with the differential signals PREP and PREN, and are outputted through the output terminals T1 and T2.

On the other hand, in the standby state of the driver 4, the differential signals PREP and PREN are fixed at high level. Moreover, the switching signal EI is switched from low level to high level, the switching transistors M1, M2, and M5 are switched off, and the switching transistors M11, M12, and M16 are switched on; accordingly, the differential transistors M3 and M4 are connected to the high power supply potential VDD and the low power supply potential VSS via the switching transistors M11, M12, and M16.

Furthermore, in the standby state of the driver 4, the bias voltage VBIAS2 is set in such a manner as to bring the bias currents I4 through the differential transistors M3 and M4 to a specified value, and the bias current I4 flows via the bias transistor M17; accordingly, the differential outputs TXR and TXN of the driver 4 are fixed at the common potential and are outputted through the output terminals T1 and T2. Therefore, the bias currents through the differential transistors M3 and M4 decrease from I1 to I4.

Here, when the switching signal EI is maintained at high level, the bypass transistor M8 is switched on, and the bypass current I2 is outputted from the bypass circuit 2. Then, upon transition between the operating state and the standby state of the driver 4, the bias voltage VBIAS is set in such a manner as to compensate, for decreases in the bias currents I2 through the differential transistors M3 and M4; accordingly, the bias current I2 flows to the low power supply potential VSS side via the bias transistor M6. Consequently, even if the bias currents flowing via the differential transistors M3 and M4 decrease upon transition between the operating state and the standby state of the main driver 1, the common current I3 flowing through the driver 4 is maintained constant.

Here, the number of transistors can be reduced compared with the configuration of FIG. 3 and the circuit can be downsized by having the driver 4 have a combination of the function of the main driver 1 and the function of the standby driver 3, which are illustrated in FIG. 3.

Although, in the example of FIG. 6, the description has been given of the case of applying the configuration where the common current I3 through the differential output buffer is made to increase and decrease slowly, a configuration where the common current I3 through the differential output buffer is made to increase and decrease in stages may be applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A differential output buffer, comprising:
    a main driver configured to shift a level of a differential signal; and
    a bypass circuit configured to bypass current flowing through the main driver in such a manner as to contain a change amount of current through the main driver flowing from a high power supply potential to a low power supply potential in a fixed range upon transition between an operating state and a standby state of the main driver, wherein
    the main driver includes:
        a pair of differential transistors constituting a differential pair;
        a switching transistor configured to switch the operating state and the standby state of the main driver; and
        a bias transistor configured to set bias current through the differential transistors, and wherein
        the switching transistor is switched off during the standby state, and the bypass circuit is configured to maintain a first current from the high power supply potential to the low power supply potential constant by making bypass current to flow via the bias transistor upon transition between the operating state and the standby state of the main driver, wherein
    the bypass circuit includes:
        a first bypass transistor having a source connected to a power supply potential; and
        a second bypass transistor connected between a connection point of the bias transistor and the third switching transistor and the first bypass transistor.

2. The differential output buffer according to claim 1, wherein
    switching signals for switching the operating state and the standby state of the main driver are adapted to be inputted to gates of the first and the second switching transistors and a gate of the second bypass transistor, and an inverting switching signal is adapted to be inputted to a gate of the third switching transistor.

3. A differential output buffer, comprising:
    a main driver configured to shift a level of a differential signal;
    a standby driver configured to fix differential outputs of the main driver at a common potential in a standby state; and
    a bypass circuit configured to bypass common current flowing through the main driver in such a manner as to contain a change amount of common currents flowing through the main driver and the standby driver in a fixed range upon transition between an operating state and a standby state of the main driver, wherein
    the main driver includes:
        a pair of differential transistors constituting a differential pair;
        a main switching transistor configured to switch the operating state and the standby state of the main driver; and
        a first bias transistor configured to set bias currents through the differential transistors,
    the standby driver includes:
        a standby switching transistor configured to switch the differential outputs of the main driver to the common potential in the standby state; and
        a second bias transistor configured to set a bias current through the standby switching transistor, and wherein
        the main switching transistor is switched off during the standby state, and the bypass circuit is configured to maintain the common current constant by making bypass current to flow via the first bias transistor upon transition between the operating state and the standby state of the main driver.

4. The differential output buffer according to claim 3, wherein the first bias transistor is configured to increase and decrease the common current slowly by increasing and decreasing bias voltage slowly in the standby state.

5. The differential output buffer according to claim 3, wherein the first bias transistor has a plurality of parallel transistors connected in parallel with each other and is configured to increase and decrease the common current in stages by changing the number of the parallel transistors to be switched on in the standby state.

6. The differential output buffer according to claim 3, wherein
the differential transistors have a first differential transistor and a second differential transistor to which differential signals are to be inputted,
the main switching transistor has:
a first switching transistor connected in series with the first differential transistor via a first resistor;
a second switching transistor connected in series with the second differential transistor via a second resistor; and
a third switching transistor connected to a source of the first differential transistor and a source of the second differential transistor,
the first bias transistor is connected in series with the third switching transistor,
the standby switching transistor has:
a fourth switching transistor having a drain to which a first differential output of the main driver is to be inputted;
a fifth switching transistor having a drain to which a second differential output of the main driver is to be inputted;
a sixth switching transistor connected in series with the fourth switching transistor via a third resistor;
a seventh switching transistor connected in series with the fifth switching transistor via a fourth resistor; and
an eighth switching transistor connected to a source of the sixth switching transistor and a source of the seventh switching transistor, and
the second bias transistor is connected in series with the eighth switching transistor.

7. The differential output buffer according to claim 6, wherein
the bypass circuit includes:
a first bypass transistor having a source connected to a power supply potential; and
a second bypass transistor connected between a connection point of the bias transistor and the third switching transistor and the first bypass transistor.

8. The differential output buffer according to claim 7, wherein
switching signals for switching the operating state and the standby state of the main driver are adapted to be inputted to gates of the first, the second, the sixth, and the seventh switching transistors, and a gate of the second bypass transistor, and
inverting switching signals are adapted to be inputted to gates of the third, the fourth, and the fifth switching transistors.

9. A differential output buffer, comprising:
a driver configured to shift a level of a differential signal in an operating state, and to fix differential outputs at a common potential in a standby state; and
a bypass circuit configured to bypass common current flowing through the driver in such a manner as to contain a change amount of the common current flowing through the driver within a fixed range upon transition between the operating state and the standby state of the driver, wherein
the driver has:
a pair of differential transistors constituting a differential pair;
a switching transistor configured to switch the operating state and the standby state of the driver;
a first bias transistor configured to set bias current in the operating state of the differential transistors; and
a second bias transistor configured to set bias current in the standby state of the differential transistors, and wherein
the switching transistor is switched off during the standby state, and the bypass circuit is configured to maintain the common current constant by making bypass current to flow via the first bias transistor upon transition between the operating state and the standby state of the driver, wherein
the differential transistors have a first differential transistor and a second differential transistor to which differential signals are to be inputted,
the switching transistor has:
a first switching transistor connected in series with the first differential transistor via a first resistor;
a second switching transistor connected in series with the second differential transistor via a second resistor;
a third switching transistor connected to a source of the first differential transistor and a source of the second differential transistor;
a fourth switching transistor having a drain to which a first differential output of the driver is to be inputted via a third resistor;
a fifth switching transistor having a drain to which a second differential output of the driver is to be inputted via a fourth resistor; and
a sixth switching transistor connected to the source of the first differential transistor and the source of the second differential transistor,
the first bias transistor is connected in series with the third switching transistor, and
the second bias transistor is connected in series with the sixth switching transistor.

10. The differential output buffer according to claim 9, wherein
the bypass circuit includes:
a first bypass transistor having a source connected to a power supply potential; and
a second bypass transistor connected between a connection point of the bias transistor and the third switching transistor and the first bypass transistor.

11. The differential output buffer according to claim 10, wherein
switching signals for switching the operating state and the standby state of the driver are adapted to be inputted to gates of the first, the second, and the sixth switching transistors and a gate of the second bypass transistor, and
inverting switching signals are adapted to be inputted to gates of the third, the fourth, and the fifth switching transistors.

* * * * *